(12) United States Patent
Robinson

(10) Patent No.: US 7,652,667 B2
(45) Date of Patent: Jan. 26, 2010

(54) METHOD AND APPARATUS FOR VISUALLY INDICATING MASK VIOLATION LOCATIONS

(75) Inventor: Tristan A. Robinson, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 10/942,213

(22) Filed: Sep. 15, 2004

(65) Prior Publication Data

US 2006/0055709 A1    Mar. 16, 2006

(51) Int. Cl.
*G09G 5/22* (2006.01)
(52) U.S. Cl. .................................. 345/440.1
(58) Field of Classification Search ............... 345/440.1
See application file for complete search history.

(56) References Cited

U.S. PATENT DOCUMENTS

| | | | | |
|---|---|---|---|---|
| 4,163,971 A * | 8/1979 | Morin et al. .................. | 345/40 |
| 4,977,514 A * | 12/1990 | Bush ........................... | 702/67 |
| 6,414,691 B1 * | 7/2002 | Nakagawa et al. ........... | 345/619 |
| 6,806,877 B2 * | 10/2004 | Fernando ..................... | 345/440 |
| 6,980,212 B2 * | 12/2005 | Letts ........................ | 345/440.1 |
| 2002/0140699 A1 * | 10/2002 | Miyadai ..................... | 345/440 |
| 2003/0085897 A1 * | 5/2003 | Shubert et al. .............. | 345/440 |
| 2004/0260192 A1 * | 12/2004 | Yamamoto ................... | 600/523 |

* cited by examiner

*Primary Examiner*—Aaron M Richer
(74) *Attorney, Agent, or Firm*—Bennet K. Langlotz; Thomas F. Lenihan; Francis I. Gray

(57) ABSTRACT

A digital storage oscilloscope having a display screen to display a waveform, and a mask defining compliant and non-compliant regions. A method of operating the oscilloscope includes receiving a signal, processing the signal, and displaying the signal on the screen. Portions of signals occupying the non-compliant region are displayed with a flashing illumination. The flashing illumination may be manually invoked to reveal small and inconspicuous violations.

6 Claims, 2 Drawing Sheets

METHOD AND APPARATUS FOR VISUALLY INDICATING MASK VIOLATION LOCATIONS

FIELD OF THE INVENTION

The subject invention generally relates to the field of information display on an oscilloscope, and specifically refers to a more effective method and apparatus for visually indicating mask violations in a mask testing application.

BACKGROUND OF THE INVENTION

Digital storage oscilloscopes (DSO) are used to test electronic devices for operational performance. A device under test is operated, and probes connected to the DSO display the signal at selected outputs or nodes on the device. The signal is displayed on a display screen of the DSO for analysis. A typical DSO display has a time domain on the horizontal axis, and voltage domain on the vertical. For high-frequency digital logic signal analysis, the time axis is established to relate to a device clock signal, such that repetitious signal activity such as switching between high and low logic states are overlaid in alignment with prior signals, so that each possible logic state transition is aligned with the possible transitions of prior clock cycles.

For the above example, a mask is provided to indicate for each point along the time domain prior to, during, and after a switching event, what voltages are acceptable, and what are not. For instance, before and after the time of switching, the accepted voltages may be within a tolerated range of either the nominal logic low voltage and the nominal logic high voltage, but in violation of the mask if below the lower limit of the low range, between the two ranges, or above the upper limit of the upper range. For a limited time before and after the expected switching time, a voltage between the ranges is also acceptable. In typical such masks, there is a temporal transition that tolerates limited deviations from the low and high ranges just before and after the transition zone, so that normally sloped (non-square, non-instantaneous) transitions are tolerated by the mask.

Often, a violation by a signal of the mask is not large and conspicuous. For instance, a "ringing" in a signal that leads the signal to momentarily overshoot the desired voltage after a transition may violate the mask by a very small amount that is difficult to see on the display screen. The violation may be only one pixel, or another small number of pixels, on a high-resolution screen having very small pixels. The mask is normally displayed, as are grid lines and other indicia, which may conceal a slight mask violation.

Existing systems highlight violations by the use of a color for the violative pixels that differs from the normal color of the compliant signal trace. While effective for large, conspicuous violations, this is ineffective for small or slight violations that are difficult for a user to visualize. Moreover, these difficulties are worse when the DSO is displaying thousands of overlaid traces on the same mask, so that individual traces may not be discerned. In addition, where there are several violations, large conspicuous ones may distract from or obliterate smaller ones of importance.

SUMMARY OF THE INVENTION

A digital storage oscilloscope has a display screen to display a waveform, and a mask defining compliant and non-compliant regions. A method of operating the oscilloscope includes receiving a signal, processing the signal, and displaying the signal on the screen. Portions of signals occupying the non-compliant region are displayed with a flashing illumination. The flashing illumination may be manually invoked to reveal small and inconspicuous violations

BRIEF DESCRIPTION OF THE DRAWINGS

FIG. 3 shows an enlarged portion of the screen of FIG. 2, with a flashing portion highlighted.

DETAILED DESCRIPTION OF A PREFERRED EMBODIMENT

Figure 1:
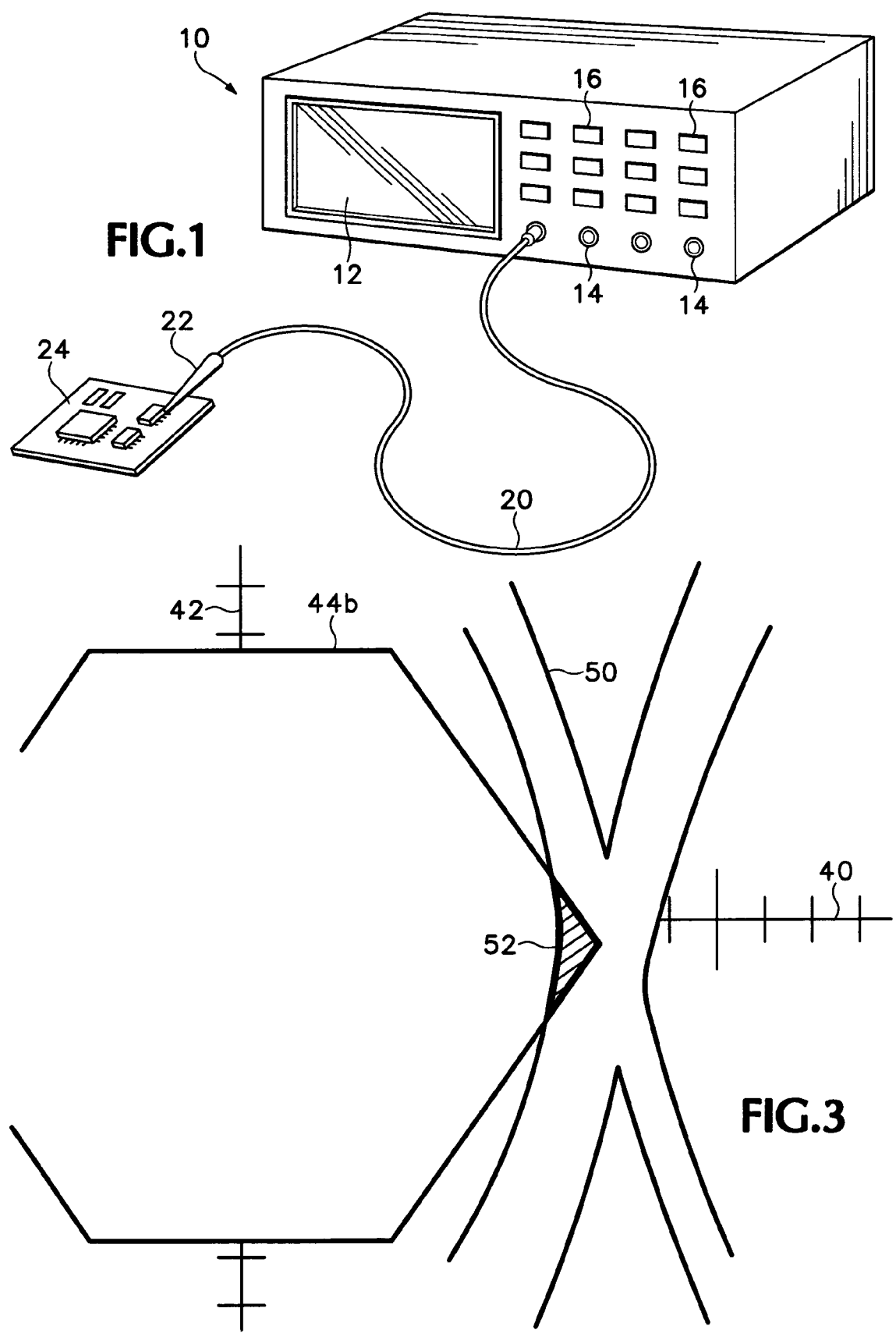
FIG. 1 shows a simplified illustration of an oscilloscope according to a preferred embodiment of the invention

FIG. 1 shows a Digital Storage Oscilloscope (DSO) 10 according to the preferred embodiment of the invention. In most respects, it is functionally identical to the TDS3000-series oscilloscopes manufactured by Tektronix, Inc., of Beaverton, Oreg., and its successors and related models. The scope 10 has an electronic display screen 12, a plurality of input jacks 14, and an array of control buttons and knobs 16. A cable 20 is connected to an input, and has a probe 22 at a free end. The probe has a contact tip that operates to contact conductive nodes of a device 24 under test, which may be a prototype electronic assembly or circuit such as a circuit board. The scope 10 contains internal control circuitry connected to receive the input signal, and process it for display. The internal circuitry includes memory elements for storing data including standardized masks for different electronic performance and communication standards such as Ethernet protocol.

Figure 2:
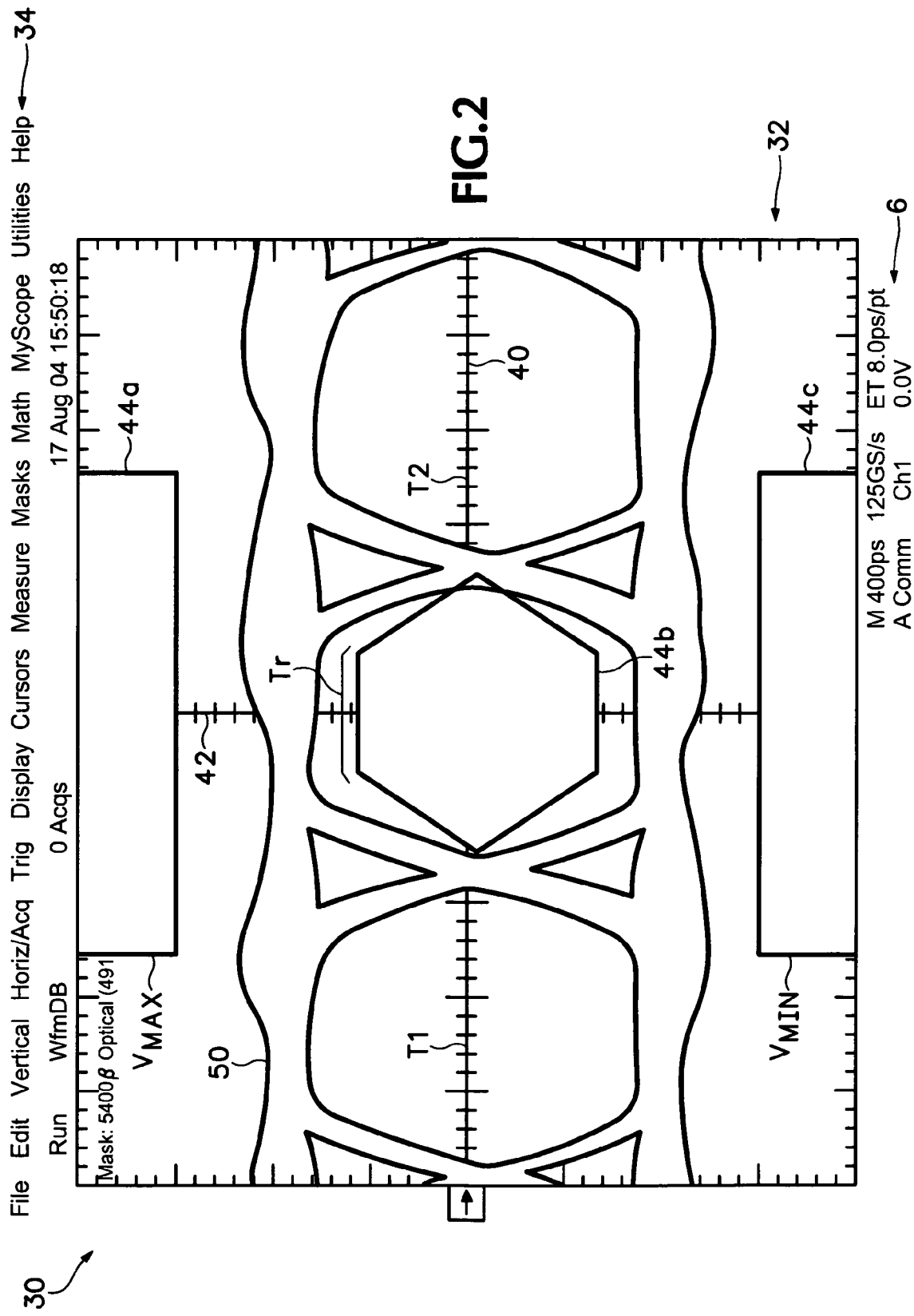
FIG. 2 shows a sample display screen image from an oscilloscope operating according to a preferred embodiment of the invention.

FIG. 2 shows a sample display screen image 30 of an optical standard mask. The image includes a main graph 32, text menu 34, and text data 36. The graph portion is an orthogonal graph having a horizontal axis 40 representing the time domain, and a vertical axis 42 representing voltage. The axes and other graph portions have lines and gridded dots indicating scale divisions. The axes' scales may be adjusted by the user to provide a useful output. The graph includes a display of a mask 44, which includes several regions of time and frequency that are considered "out-of-bounds" or in violation of desired performance for a selected protocol or standard represented by the mask.

In the illustrated example the mask applies only to the interval between a first time T1, and a second time T2. A first violation region 44a represents all voltages in excess of Vmax during the time interval. A second violation region 44b is a hexagonal shape having upper and lower limits representing the tolerated minimum for a "high" voltage, and tolerated maximum for a "low" signal. Before and after a central time range Tr, the central region tapers down to an intermediate or transition voltage that may be zero in some embodiments. A third violation region 44c represents all voltages less than Vmin during the time interval. In the central time range Tr, the signal must either remain in the high range, or in the low range, without going beyond or between the tolerated voltage ranges.

The screen shot includes a signal trace 50 that is a composite of a multitude of overlaid repeated signal segments, synchronized to overlay with a common reference time point, typically a clock signal. The trace may include tens of thousands of signal segments, so that each illuminated point or pixel on the display may represent hundreds or thousands of segments that passed over that voltage at that time with respect to the reference clock synch.

As long as no portion of the signal trace overlays or intersects any violation region of the mask, the signal is compliant. If even one pixel of the signal overlays the mask regions, there is a violation. The preferred embodiment of the invention serves to display such small violations in a readily discernable form. The illustration shows the screen background as white, and the signal trace and mask as black for practical clarity. In the preferred embodiment, the display screen employs full color capability. The background may be black, the mask dark blue, and the grid lines grey, and the signal trace a noticeable bright color such as magenta or yellow. In the prior art, it is difficult for a user to determine whether a signal trace near a mask boundary is violating the mask or not. This is especially true when the mask is very complex, and the signal trace image spreads to near the mask borders in many places.

FIG. 3 shows an enlarged portion of the display screen showing that the signal trace 50 has overlapped with the right corner of the central mask portion 44b. The overlapped portion is labeled as violation area 52, and is highlighted for the illustration in hatched lines. In the preferred embodiment the scope 10 is operable on command by the user to cause the violations to flash in a cyclical pattern of changing brightness. Preferably, the scope operates to collect and process the signal data, without any display flashing, even upon violation. Normally, a large violation may be viewed without flashing being needed to visualize or highlight it. Such a violation may be enhanced by the use of a different color, or a brighter display level for the area of violation.

However, such measures may be inadequate for small violations. Therefore, the system operates to permit the user to input a request to display violations in flashing mode. The system may provide an alert in the form of audible or visual annunciator or message that a violation has occurred. If the violation is obvious to the user, he need not do anything to further discern it. If the violation is not evident, or if there are any many violations that might conceal additional small violations, the user may input the request to highlight all violations. This would be requested by pressing a button on the scope's control panel.

In alternative variants, the flashing mode may be automatically invoked by the DSO circuitry when the violation area is less than a preselected number of pixels. This pixel threshold count may be adjusted based on the preferences of the user. In other alternatives, the violation-highlighting display modes may include animation other than or in addition to flashing, including animated target rings or ripples that radiate concentrically outward from violations. Other highlighting methods may simply include arrows or circles that indicate violations, although these are less suitable for applications where data is densely displayed, and might thus be concealed by the indicators.

The flash rate for highlighting data violations may vary based on the user preferences, and the environment in which the system operates. In the preferred embodiment, a flash rate of 2 on-off flash cycles per second is adequately fast to avoid an excessive dark period in which a user might miss data at a glance, or have to wait to observe the violating data points. The flash rate is sufficiently slow that it is not confused with screen refresh or flicker rate of 50-100 Hz. This 50-100 Hz range also corresponds to the flicker detection threshold of the human eye. That is, flicker occurring at a rate below 50 Hz can be readily visually detected by most people. Flash rates in the range of 0.5-10 cycles per second are significantly less than the above mentioned 50-100 Hz refresh rates, and are believed to be suitable for purposes of the subject invention. Moreover, the flash rate is preferably user-adjustable. The flashing operation exploits the human eye's perception of flashing as movement, attracting attention when in a peripheral field of view.

This disclosure is made in terms or preferred and alternative embodiments, and is not intended to be so limited. For instance, the various modes of highlighting mask violation may be used in combination, for instance with large violations indicated by a different color, and small violations indicated by flashing or other animated emphasis.

The invention claimed is:

1. A method of operating a digital storage oscilloscope comprising:
    receiving a signal at an input of the oscilloscope;
    providing a display screen operable to display a waveform representative of said signal;
    providing a mask having a first compliant region in which the waveform is desired to remain;
    the mask having a second non-compliant region in which the waveform is in violation of the mask rules, said violation being an intersection of a pixel of said waveform and a pixel of said second non-compliant region of said mask;
    displaying the waveform on the screen;
    displaying the mask;
    displaying portions of signals occupying the compliant region with a constant illumination;
    displaying portions of signal occupying the non-compliant region with a cyclically changing illumination; and
    wherein displaying portions of signals occupying the non-compliant region with a cyclically changing illumination includes limiting the changing illumination to non-compliant signal portions encompassing less than a predetermined number of pixels; and
    wherein said predetermined number of pixels is adjustable in response to input by a user.

2. The method of claim 1 wherein the cyclically changing illumination changes at a predetermined rate, said predetermined rate being between 0.5 and 10 Hz.

3. The method of claim 2 wherein the predetermined rate is adjustable in response to input by a user.

4. A digital storage oscilloscope comprising:
    a signal input connection operable to receive a signal;
    processor circuitry connected to the signal input connection;
    a display screen operably connected to the processor circuitry;
    a data set corresponding to a selected mask stored in the processor circuitry;
    the mask having a compliant region in which the signal complies with the mask;
    the mask having a non-compliant region in which the signal violates the mask, said violation being an intersection of a pixel of said waveform and a pixel of said non-compliant region of said mask;
    the processor circuitry operable to display the mask on the display screen from the data set, a waveform representative of the signal on the display screen, and a signal portion occupying the non-compliant region with flashing illumination; and
    including control means for limiting the flashing illumination to non-compliant signal portions encompassing less than a predetermined number of pixels;

wherein said predetermined number of pixels is adjustable in response to input by a user.

5. The digital storage oscilloscope of claim 4 wherein the flashing illumination changes at a predetermined rate, said predetermined rate being between 0.5 and 10 Hz.

6. The digital storage oscilloscope of claim 5 wherein said predetermined rate is adjustable in response to input by the user.

* * * * *